United States Patent [19]
Abe et al.

[11] Patent Number: 5,911,822
[45] Date of Patent: Jun. 15, 1999

[54] METHOD OF MANUFACTURING SILICON MONOCRYSTAL, AND SEED CRYSTAL USED IN THE METHOD

[75] Inventors: Takao Abe; Masanori Kimura, both of Annaka, Japan

[73] Assignee: Shin-Etsu Handotai Co., Ltd., Tokyo, Japan

[21] Appl. No.: 09/007,614

[22] Filed: Jan. 15, 1998

[30] Foreign Application Priority Data

Jan. 17, 1997 [JP] Japan ..................................... 9-017687

[51] Int. Cl.$^6$ .................................................. C30B 15/32
[52] U.S. Cl. .............................................. 117/13; 117/911
[58] Field of Search ................................. 117/13, 35, 911

[56] References Cited

U.S. PATENT DOCUMENTS 5,487,355  1/1996  Chiou et al. ............................... 117/13

FOREIGN PATENT DOCUMENTS 61-132034  12/1987  Japan ............................. C30B 15/30
5139880     6/1993  Japan ............................. C30B 15/36
405270968  10/1993  Japan ..................................... 117/35
9255485     9/1997  Japan ............................. C30B 15/36

*Primary Examiner*—Felisa Hiteshew
*Attorney, Agent, or Firm*—Loeb & Loeb LLP

[57] ABSTRACT

In a method of manufacturing a silicon monocrystal using the Czochralski method, there is used a seed crystal whose tip end has a sharp-pointed shape or a truncation thereof. The tip end of the seed crystal is gently brought into contact with the silicon melt, and the seed crystal is then lowered at a low speed in order to melt the tip end portion of the seed crystal until the size of the tip portion increases to a desired value. Subsequently, the seed crystal is slowly pulled upwardly in order to grow a silicon monocrystalline ingot having a desired diameter without performing necking operation. This method enables a heavy silicon monocrystal to be pulled quite simply without performance of necking operation, while eliminating the necessity of using a complicated apparatus such as a crystal holding mechanism.

18 Claims, 2 Drawing Sheets

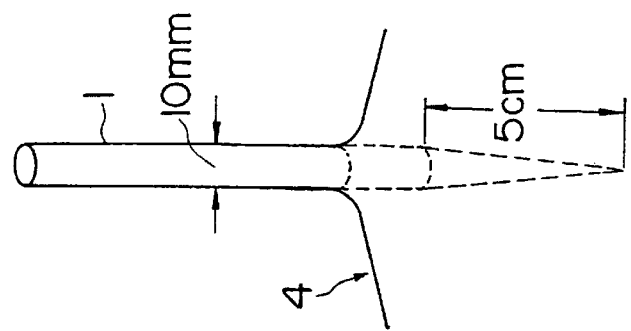
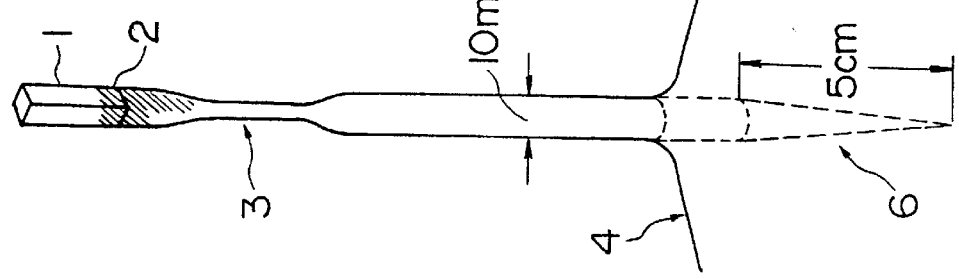
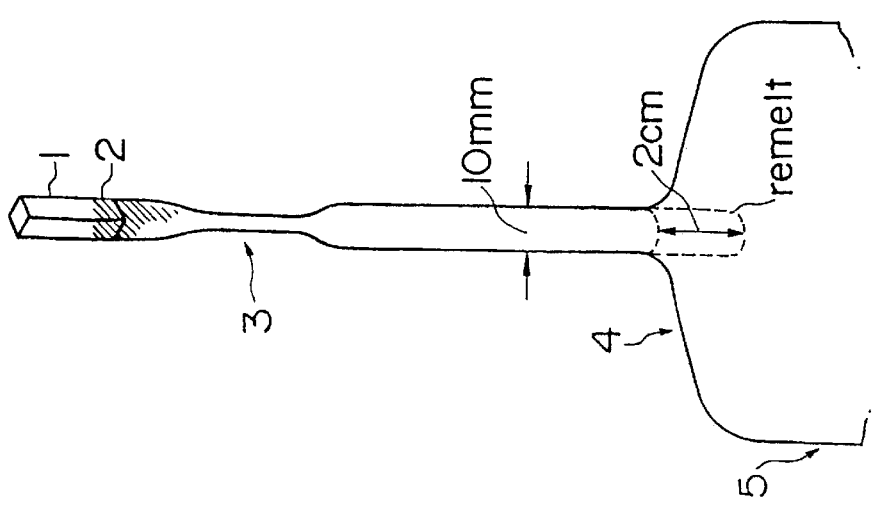

FIG. 2A  FIG. 2B  FIG. 2C  FIG. 2D
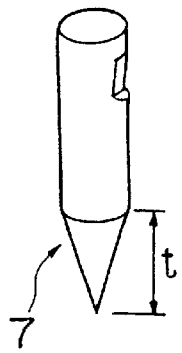 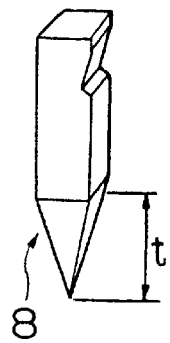 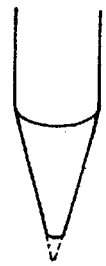 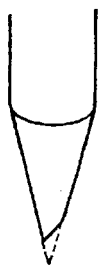
*PRIOR ART*
FIG. 3A  FIG. 3B
 

METHOD OF MANUFACTURING SILICON MONOCRYSTAL, AND SEED CRYSTAL USED IN THE METHOD

BACKGROUND OF THE INVENTION

1. Field of the Invention

The present invention relates to a method of manufacturing a silicon monocrystal in accordance with the Czochralski (CZ) method without performing a so-called necking operation. Further, the present invention relates to a seed crystal for use in the manufacturing method.

2. Description of the Related Art

In the manufacture of a silicon monocrystal using the Czochralski (CZ) method, monocrystalline silicon has conventionally been used as a seed crystal. A silicon monocrystalline ingot is grown by bringing the seed crystal into contact with silicon melt and pulling the seed crystal slowly while it is rotated. At this time, operation for forming a neck portion (necking operation) is performed in order to eliminate dislocations generated in the seed crystal at a high density as a result of thermal shock arising when the seed crystal is brought into contact with the silicon melt. Subsequently, the diameter of the crystal is increased to a desired diameter, and the silicon monocrystalline ingot is then pulled. The necking operation has been well known as a "Dash Necking Method," and use of this method has been a common practice in the case where a silicon monocrystal ingot is pulled in accordance with the CZ method.

Specifically, as shown in FIGS. 3A and 3B, a conventional seed crystal is formed into a cylindrical shape having a diameter of about 8–20 mm or into a prismatic shape having sides of about 8–20 mm, and a cut-away portion is formed for attachment to a seed crystal holder. The tip or lower end of the seed crystal, which end first comes into contact with silicon melt, is formed to have a flat surface. In order to safely pull a heavy monocrystalline ingot while sustaining the weight of the ingot, the seed crystal must have a dimension in the above-described range.

However, since the seed crystal having the above-described shape and dimension has a large heat capacity at the tip end which comes into contact with silicon melt, a steep temperature gradient is generated instantaneously within the crystal when the seed crystal comes into contact with the melt, so that slip dislocation is generated at a high density. Therefore, the above-described necking operation is required for growing a monocrystal while eliminating the dislocation.

In the Dash Necking Method, after a seed crystal is brought into contact with silicon melt, the diameter of the crystal is reduced to about 3 mm before being increased, in order to form a neck portion to thereby eliminate dislocation induced from slip dislocation generated in the seed crystal and thereby to be grown a dislocation-free monocrystal.

However, in such a method, even when conditions for the necking operation are selected appropriately, the diameter of the crystal must be decreased to 5–6 mm or less in order to eliminate the dislocation. In such a case, the strength becomes insufficient to support a monocrystalline ingot whose weight has been increased with a recent increase in the diameter thereof, resulting in a high risk of fracture of the neck portion during the course of pulling of the monocrystalline ingot. This may result in serious accidents such as a drop of the monocrystalline ingot.

To solve the above-described problem, there has been developed a method of pulling a recent heavy large-diameter monocrystalline ingot through use of a crystal holding mechanism (see, e.g., Japanese Patent Publication (kokoku) No. 5-65477).

In this method, a growing monocrystalline ingot is held directly and mechanically, in consideration of the above-described knowledge that necking operation is indispensable for elimination of dislocation and that therefore the strength of the neck portion cannot be increased.

However, in such a method, a monocrystalline ingot—which is grown at a high temperature while being rotated—is directly held, an apparatus used for implementing the method becomes complicated and expensive and also raises a problem related to heat resistance. Further, in practice, it is extremely difficult to hold a growing crystal without generating vibration therein, so that the growing crystal may become a polycrystal. Moreover, since a complicated apparatus including mechanisms for rotation, sliding, and other motions must be disposed above a silicon melt of high temperature, there arises a problem that the crystal may be contaminated by heavy metal impurities.

In order to solve these problems, the applicant of the present invention has proposed various inventions such as those disclosed in Japanese Patent Application Laid-Open (kokai) No. 5-139880 and Japanese Patent Application No. 8-87187. According to these inventions, the tip end of a seed crystal is formed into a wedge shape or is formed to have a hollow portion in order to reduce, to the extent possible, slip dislocation which would otherwise be generated when the seed crystal comes into contact with silicon melt. These inventions enable elimination of dislocation, even when the neck portion is formed to have a relatively large diameter, thereby increasing the strength of the neck portion.

Although the methods according to the inventions can increase the strength of the neck portion to some degree through an increase in the diameter of the neck portion, the methods still require necking operation, resulting in formation of a neck portion having slip dislocation. Therefore, in some cases, the strength of the neck portion of a monocrystalline ingot manufactured in accordance with either of these methods becomes insufficient for pulling the ingot if the monocrystalline ingot has a weight of 150 Kg or more as a result of recent increases in the diameter and length thereof. Accordingly, the methods do not thoroughly solve the problems involved in the prior art methods.

SUMMARY OF THE INVENTION

The present invention has been conceived in view of the foregoing drawbacks in the prior art. An object of the present invention is to provide a method of manufacturing a silicon monocrystal, which method can make a growing crystal monocrystalline without carrying out necking operation for forming a neck portion, which would cause a problem in terms of strength, thereby enabling a heavy silicon monocrystal having a large diameter and length to be pulled quite simply while eliminating the necessity of using a complicated apparatus such as a crystal holding mechanism.

Another object of the present invention is to provide a silicon seed crystal used in the above method.

To achieve the object, the present invention provides a method of manufacturing a silicon monocrystal using the Czochralski method in which a seed crystal is brought into contact with silicon melt and is then slowly pulled while being rotated in order to grow a silicon monocrystalline ingot below the seed crystal, the method comprising the steps of: providing a seed crystal having a tip end to be brought into contact with the silicon melt, said tip end having a sharp-pointed shape or a truncation thereof; gently bringing the tip end of the seed crystal into contact with the silicon melt and then lowering the seed crystal at a low speed in order to melt the tip end portion of the seed crystal until the size of the tip portion increases to a desired value; and subsequently, pulling upwardly the seed crystal slowly in order to grow a silicon monocrystalline ingot having a desired diameter without performing necking operation.

Since a seed crystal whose tip end has a sharp-pointed shape or a truncation thereof is used, a contact area through which the tip end of the seed crystal is first brought into contact with the silicon melt is small, and the heat capacity of the tip end portion is small. Thus, generation of heat shock or a steep temperature gradient is prevented within the seed crystal, so that generation of slip dislocation is prevented.

When the seed crystal is lowered at a low speed such that the tip end portion of the seed crystal is melted until the size of the tip portion increases to a desired value, it becomes possible to melt the seed crystal to a desired size, while preventing the formation of a steep temperature gradient within the seed crystal (In this specification, the term "size" means diameter if the tip end has a circular cross section and means transverse dimension if the tip end has a rectangular cross section). Therefore, no slip dislocation is generated within the seed crystal during the above-described melting operation.

Finally, the seed crystal is slowly pulled upwardly while the temperature, pulling speed, and other conditions are controlled, in order to grow a silicon monocrystalline ingot. Since the seed crystal has a desired size and no dislocation, it is not required the necking operation, and it therefore has a sufficient strength, allowing the seed crystal to be grown to a desired diameter to yield the silicon monocrystalline ingot.

Preferably, before the tip end of the seed crystal is gently brought into contact with the silicon melt, the seed crystal is held immediately above the silicon melt in order to increase the temperature of the seed crystal.

When the seed crystal is brought into contact with the silicon melt after the temperature of the seed crystal is increased, heat shock generated upon contact of the seed crystal with the silicon melt is mitigated, so that generation of slip dislocation can be prevented more reliably. Especially, the step of increasing the temperature of the seed crystal is required in the case where the tip end of the seed crystal is a truncation of a sharp-pointed shape.

Preferably, the speed at which the seed crystal is lowered for melting the tip end thereof is 20 mm/min or less.

Melting at such a low speed further reduces the possibility that slip dislocation is generated within the seed crystal during the melting operation.

The present invention also provides a silicon seed crystal used for manufacture of a silicon monocrystalline ingot according to the CZ method, wherein the tip end of the seed crystal to be brought into contact with silicon melt has a sharp-pointed shape or a truncation thereof.

Since the tip end of the seed crystal has a sharp-pointed shape or a truncation thereof, a contact area through which the tip end of the seed crystal is first brought into contact with the silicon melt is small, and the heat capacity of the tip end portion is small. Thus, generation of heat shock or a steep temperature gradient is prevented within the seed crystal when the seed crystal is brought into contact with the silicon melt, so that generation of slip dislocation is prevented.

When the seed crystal is lowered at a low speed such that the tip end portion of the seed crystal is melted until the size of the tip portion increases to a desired value, the contact area between the immersed portion of the seed crystal and the melt gradually increases. Therefore, generation of a steep temperature gradient is prevented within the seed crystal, so that no slip dislocation is generated within the seed crystal during the above-described melting operation.

Preferably, the tip end of the seed crystal has a conical shape or a pyramidal shape. In this case, machining of the seed crystal is facilitated. Further, since the tip end of the seed crystal has a symmetrical shape, the temperature gradient becomes uniform and therefore slip generation is hardly generated.

Preferably, the end surface of the seed crystal to be first brought into contact with the silicon melt has an area of $9\pi$ (mm$^2$) or less, more preferably $2.25\pi$ (mm$^2$) or less.

When the area of the end surface of the seed crystal to be first brought into contact with the silicon melt is decreased as described above, the heat capacity of the tip end decreases, so that heat shock upon contact can be decreased. Therefore, the ideal shape is a perfectly pointed shape, whose contact area has been reduced to zero.

In the present invention, a silicon crystal ingot can be made monocrystalline without performance of necking operation for forming a neck portion, which would otherwise cause a problem in terms of strength when the silicon crystal ingot is pulled in accordance with the conventional CZ method. Thus, a heavy silicon monocrystal having a large diameter and length can be pulled quite simply while eliminating the necessity of using a complicated apparatus such as a crystal holding mechanism.

Consequently, a silicon monocrystalline ingot having a diameter of 8–12 inches or more—which has recently been demanded—can be pulled to a desired length without the danger of serious accidents such as a drop of the monocrystalline ingot. Further, since necking operation is unnecessary, production efficiency is improved. Moreover, since the stroke over which the seed crystal is vertically moved can be reduced by an amount corresponding to the length of a neck portion, the size of the pulling apparatus can be reduced. Accordingly, the productivity and yield of large-diameter silicon monocrystalline ingots can be improved remarkably while reducing production costs.

BRIEF DESCRIPTION OF THE DRAWINGS

FIGS. 1A–1C are explanatory views for explaining tests 1–3;

FIGS. 2A–2D are perspective views of seed crystals according to the present invention, wherein FIG. 2A shows a cylindrical seed crystal having a conical tip end, FIG. 2B shows a prismatic seed crystal having a pyramidal tip end, FIG. 2C shows a seed crystal having a horizontally truncated tip end, and FIG. 2D shows a seed crystal having an obliquely truncated tip end; and FIGS. 3A and 3B are perspective views of conventional seed crystals, wherein FIG. 3A shows a cylindrical seed crystal, and FIG. 3B shows a prismatic seed crystal.

DESCRIPTION OF THE INVENTION AND PREFERRED EMBODIMENTS

The present invention and embodiments thereof will now be described. However, the present invention is not limited thereto.

The inventors of the present invention had doubts about the common knowledge, concerning the Czochralski (CZ) method, that slip dislocation is generated when a monocrystalline seed crystal comes into contact with silicon melt and therefore a monocrystalline ingot cannot be pulled unless necking operation is carried out after the contact, and studied the matter in various ways in order to determine whether the seed crystal can be brought into contact with the melt without generating slip dislocation within the seed crystal.

If a seed crystal can be brought into contact with silicon melt without generating slip dislocation within the seed crystal, this would obviate the need to carry out necking operation in order to form a neck portion, thereby enabling to use the seed crystal to be grown to a desired diameter in order to grow a silicon monocrystalline ingot.

If such a growing operation is to be realized, there must be solved the various associated problems such as problems involved in seed crystal holders and insufficient strength stemming from generation of slip dislocation.

When a seed crystal comes into contact with silicon melt, the tip end of the seed crystal is partially melted and the seed crystal joins with the silicon melt, thereby enabling subsequent crystal growth. However, when the monocrystal (seed crystal) comes into contact with silicon melt as described above or separates therefrom, dislocation is generated. The inventors of the present invention discovered an interesting phenomenon in relation to such dislocation.

As is known, when a silicon monocrystalline ingot is intentionally separated from silicon melt while the ingot is being grown in accordance with the CZ method, slip dislocation is generally generated in a grown monocrystalline portion along a temperature gradient, and the density and area of generated slip dislocation depend on the temperature gradient within the growing monocrystalline ingot. When the growth rate of the monocrystalline ingot is increased to make the temperature gradient larger, the density and area of the slip dislocation increase, whereas when the growth rate of the monocrystalline ingot is decreased to make the temperature gradient smaller, the density and area of the slip dislocation decrease. Especially, when a crystal ingot that is being grown at a very slow speed is separated from silicon melt, no slip dislocation is generated in some cases. From the above, it is considered that a monocrystal in contact with silicon melt can be separated from the silicon melt without generation of slip dislocation.

Meanwhile, in a so-called FZ (Floating Zone) method, a melt zone of silicon is formed in order to grow a monocrystalline ingot, and the width of the melted zone can be easily increased through an increase in the heater power during growth of the monocrystalline ingot. Under such conditions, although a grown portion of the monocrystalline ingot in contact with the silicon melt is melted again, dislocation is seldom generated therefrom. From the above phenomenon, it is considered that a portion of a monocrystal in contact with silicon melt can be melted without generation of slip dislocation within the monocrystal.

Further, during growth of a silicon monocrystalline ingot in accordance with the CZ method, the growth rate can be freely changed within a predetermined range through, for example, adjustment of the temperature. The shape of the growth interface (solid-liquid interface) of a monocrystalline ingot is known to change with growth rate during the growth of the monocrystalline ingot. Under these conditions, the grown monocrystalline portion is melted again on the solid-liquid interface. In this case as well, the pulling can be continued without generation of dislocation in the monocrystalline ingot. From this phenomenon as well, it is considered that a portion of a monocrystal in contact with silicon melt can be melted without generation of slip dislocation within the monocrystal.

In consideration of all of the above-described phenomena, it is considered that even when a silicon monocrystal comes into contact with silicon melt or separates therefrom, or is melted, dislocation is not generated so long as generation of heat shock or steep temperature gradient can be prevented.

In order to confirm that the above-described consideration is correct, the following tests were conducted.

Test 1:

As shown in FIG. 1A, a conventional necking operation was first performed through use of an ordinary seed crystal 1 having a prismatic shape. Specifically, a neck portion 3 was formed in order to remove slip dislocation 2 generated upon contact of the seed crystal 1 with silicon melt, thereby making the crystal dislocation free. Subsequently, the crystal was grown to have a diameter of about 10 mm, and the growth of the monocrystal was continued. The monocrystal having a diameter of about 10 mm was grown until the length of the monocrystal became about 10 cm, and the pulling of the seed crystal was stopped in order to stop the growth of the monocrystal. Subsequently, the seed crystal was lowered slowly at a speed of 3 mm/min in order to immerse a portion (about 2 cm long) of the grown monocrystal into the silicon melt for remelting. When the 2 cm-long portion was melted again, the seed crystal was pulled again, while the temperature of the melt was lowered, in order to form a cone portion 4. When the diameter of the monocrystal became 10 cm, a straight body portion 5 was grown through continuation of the pulling operation. In this case, the growth of the monocrystalline ingot was continued in a dislocation-free state. Further, the test was performed under the condition that the seed crystal was lowered slowly at speeds of 10 mm/min and 20 mm/min respectively, and the same result was obtained.

From the test results, it is understood that no slip dislocation is generated when a monocrystal having a diameter of about 10 mm—which is the same as that of a conventional seed crystal—is merely melted after the monocrystal comes into contact with silicon melt.

The reason for this phenomenon is considered to be that because the monocrystal which has already come into contact with silicon melt is immersed into the silicon melt slowly in order to be melted, no heat shock acts on the monocrystal and a steep temperature gradient is not formed within the monocrystal.

Test 2:

Next, an investigation was made in order to determine whether a monocrystal that has been separated from the melt can be melted again in a dislocation-free state.

That is, as shown in FIG. 1B, a conventional necking operation was first performed through use of an ordinary seed crystal 1 having a prismatic shape. Specifically, a neck portion 3 was formed in order to remove slip dislocation 2 generated upon contact of the seed crystal 1 with silicon melt, thereby making the crystal dislocation free. Subsequently, the crystal was grown to have a diameter of about 10 mm, and the growth of the monocrystal was continued. The monocrystal having a diameter of about 10 mm was grown until the length of the monocrystal became about 10 cm, and a conical tail portion 6 having a length of about 5 cm was formed. Subsequently, the monocrystal was separated from silicon melt and the growth of the monocrystal was suspended.

The thus-formed small monocrystalline ingot was removed from a crystal manufacturing furnace in a state in which the monocrystalline ingot was connected to the seed crystal via neck portion, and the ingot was then cooled to room temperature. Subsequently, the seed crystal was attached to an unillustrated seed crystal holder and was returned to the interior of the crystal manufacturing furnace. The seed crystal was then lowered and stopped for 10 minutes at a position where the crystal tail portion 6 was held immediately above the silicon melt in order to increase the temperature of the tail portion 6.

After the temperature of the tail portion 6 was increased, the seed crystal was lowered slowly at a speed of 3 mm/min. Through this lowering operation, the tip end of the conical tail portion 6 gently came into contact with the silicon melt and was gradually melted. When the lower portion (about 2 cm long) of the straight portion having a diameter of 10 mm was immersed into the melt and melted therein, the pulling of the seed crystal was started, and a cone portion 4 was formed, while the temperature of the silicon melt was decreased, without necking operation. When the diameter of the crystal reached 10 cm, a straight body portion was grown. In this case, the growth of the monocrystalline ingot was continued in a dislocation-free state. Further, the test was performed under the condition that the seed crystal was lowered slowly from the position immediately above the silicon melt at speeds of 10 mm/min and 20 mm/min respectively, and the same result was obtained.

From the test results, it is understood that a monocrystal can be brought into contact with silicon melt and melted without generation of slip dislocation even when the monocrystal is cooled temporarily.

The cause of this phenomenon is considered to be the following. Even if a monocrystal is brought into contact with silicon melt and is melted from a state in which it is separated from the silicon melt, heat shock does not act on the monocrystal upon contact with the silicon melt, due to a small area and a small heat capacity of the portion to first come into contact with the silicon melt. Further, since the contact area increases gradually due to a subsequent slow lowering of the seed crystal, no steep temperature gradient is formed within the monocrystal during the melting.

Test 3:

Finally, an investigation was made in order to determine whether a seed crystal that has been manufactured through mechanical machining can be melted again in a dislocation-free state in order to grow a monocrystal without performance of necking operation.

First, a cylindrical crystal having a diameter of 10 mm and a length of 15 cm was cut from a dislocation-free monocrystalline ingot, and as shown in FIG. 1C, one end of the cylindrical crystal was mechanically machined into a conical shape over a length of 5 cm. Subsequently, the surface damage layer formed by the mechanical machining was removed through etching in order to manufacture a seed crystal 1 which was formed from silicon monocrystal and which had substantially the same shape as that of the conical tail portion 6 of the small monocrystalline ingot manufactured in Test 2.

A monocrystalline ingot was then grown through use of the seed crystal in a manner similar to that used in Test 2.

The seed crystal having a conical tip end was first attached to an unillustrated seed crystal holder and was then lowered and stopped for 10 minutes at a position where the conical tip was held immediately above the silicon melt in order to increase the temperature of the seed crystal.

After the temperature of the seed crystal was increased, the seed crystal was lowered slowly from that position at a speed of 3 mm/min. Through this lowering operation, the tip end of the conical portion gently came into contact with the silicon melt, and the conical portion was gradually melted. When the lower portion (about 2 cm long) of the straight portion having a diameter of 10 mm was immersed into the melt and melted therein, the pulling of the seed crystal was started, and a cone portion 4 was formed, while the temperature of the melt was decreased, without necking operation. When the diameter of the crystal reached 20 cm, a straight body portion was grown continuously. In this case, the growth of the monocrystalline ingot was continued in a dislocation-free state. Further, the test was performed under the condition that the seed crystal was lowered slowly at speeds of 10 mm/min and 20 mm/min respectively, and the same result was obtained.

Through the above-describe tests, it was found that even when a seed crystal is cut from a large monocrystalline ingot as in a conventional seed crystal and the surface damage area is removed through etching, it is possible to bring the seed crystal into contact with silicon melt without generation of slip dislocation within the seed crystal and then melt the crystal to a desired diameter while slowly increasing the contact area. The present invention was accomplished based on this finding.

This operation is possible because of the following reasons. Even when a seed crystal is brought into contact with silicon melt and is melted from a state in which it is separated from the silicon melt, heat shock does not act on the seed crystal upon contact with the silicon melt, due to a small area and a small heat capacity of the portion to first come into contact with the silicon melt. Further, since the contact area increases gradually due to a subsequent slow lowering of the seed crystal, no steep temperature gradient is formed within the seed crystal during the melting.

Accordingly, when a silicon monocrystal ingot is manufactured in accordance with the CZ method, the silicon monocrystal ingot can be grown without performance of necking operation, so long as a seed crystal having a pointed tip or a truncation of a pointed tip, either of which has a small contact area, is used, and so long as the pulling operation is performed such that the tip end of the seed crystal is gently brought into contact with the silicon melt; the seed crystal is lowered slowly such that the tip end of the seed crystal is melt to have a desired diameter sustainable to the final weight of a heavy monocystalline ingot, and is then pulled upwardly slowly in order to grow the monocrystalline ingot to a desired diameter.

In such an invention, it is necessary to form the tip end of a seed crystal to be used into a sharp-pointed shape or a truncation thereof. If the seed crystal has such a shape, the tip end of the seed crystal has a reduced initial contact area and a reduced heat capacity, so that even when the tip end of the seed crystal comes into contact with silicon melt, heat shock or a steep temperature gradient is not generated within the seed crystal, and therefor no slip dislocation is generated.

When the seed crystal is then lowered slowly and the tip end of the seed crystal is melted to have a desired diameter, the contact area between the immersed portion of the seed crystal and the melt gradually increases. Thus, the seed crystal can be melted without generation of a steep temperature gradient, so that no slip dislocation is generated within the seed crystal during the melting operation.

The tip end of the seed crystal used in the present invention is preferably formed into a conical shape or a pyramidal shape in order to have the above-described sharply-pointed shape or a truncation thereof.

If the seed crystal has such a shape, the seed crystal has a small heat capacity at the tip end thereof and the size (diameter or transversal dimension) gradually increases toward the base end thereof. Thus, the seed crystal well satisfies the requirements needed in the present invention. Further, the seed crystal can be easily machined, and the temperature gradient easily becomes uniform due to the symmetrical shape, so that no slip dislocation is generated.

In this case, the length t of a conical portion 7 or a pyramidal portion 8 of the seed crystal according to the present invention shown in FIGS. 2A and 2B may be determined arbitrarily in consideration of machining thereof. However, when the length t is excessively small, the increasing rate of the contact area with the silicon melt increases, so that the melting rate must be decreased. Conversely, when the length t is excessively large, the seed crystal is wastefully used. Therefore, the length t is preferably one to ten times the size (diameter or transverse dimension) of the seed crystal, more preferably, two to eight times the size.

Since the requirement related to the shape of the seed crystal is to have a sharply-pointed tip end whose size increases gradually toward the base end, the pyramidal shape may be a triangular pyramidal shape, a rectangular pyramidal shape, or a higher-order pyramidal shape. Further, the cross sectional shape of the straight body portion of the seed crystal is not required to correspond to the cross sectional shape of the tip end portion. For example, the tip end of a prismatic seed crystal may be formed into a conical shape. Further, different shapes may be arbitrarily combined in order to meet requirements.

In stead of the sharply-pointed shapes as shown in FIGS. 2A and 2B, the tip end of the seed crystal may have a truncated pointed shape, because the tip end of the seed crystal is difficult to be machined into a very sharp shape due to brittleness and hardness of silicon monocrystal and problems which would otherwise occur in relation to handling such as breakage of the seed crystal, and heat shock can be prevented when the contact area of the seed crystal is less than a predetermined value. Further, a way of truncating the tip end may be determined arbitrarily, and the tip end may be truncated obliquely as shown in FIG. 2D instead of being truncated horizontally.

When the tip end of the seed crystal is truncated, the initial contact area of the tip end to first come into contact with silicon melt is preferably set not greater than $9\pi$ (mm$^2$), more preferably not greater than $2.25\pi$ (mm$^2$).

This is because the results of experimental studies dislocation is eliminated through a conventional necking operation, the diameter of a neck portion formed by the necking operation must be 6 mm or less, and be 3 mm or less in order to reliably eliminate the dislocation, and that slip dislocation is likely to be generated upon contact with the silicon melt if the initial contact area is not set to be less than the above-described values.

Accordingly, in order to prevent the generation of slip dislocation which otherwise occur when the seed crystal comes into contact with the melt, there are employed a completely sharpened shape as shown in FIGS. 2A and 2B, whose contact area has been reduced to zero.

Moreover, in the present invention, before the tip end of the seed crystal having the above-described shape is gently brought into contact with silicon melt, the seed crystal is preferably held immediately above the silicon melt in order to increase and maintain the temperature of the seed crystal.

This is because if the seed crystal is brought into contact with the silicon melt after the temperature of the seed crystal has been increased, heat shock generated upon contact is mitigated, so that generation of slip dislocation can be prevented more reliably. Especially, when a seed crystal to be used has a tip end of a truncated shape, the necessity of operation for increasing the temperature of the seed crystal is high.

Needless to say, it is preferable to hold the seed crystal at a position closer to the melt for an increased period of time. However, a sufficient result can be obtained when the seed crystal is held immediately above the silicon melt for about 1–20 minutes such that the distance between the tip end of the seed crystal and the surface of the silicon melt becomes 5–100 mm.

In the present invention, the speed at which the seed crystal is lowered slowly for melting the tip end thereof after being brought into contact with the silicon melt is preferably set no greater than 20 mm/min.

Through the slow melting operation, the possibility of generation of slip dislocation within the seed crystal during the melting operation can be reduced further. Accordingly, the lowering speed is affected by the increase rate of the contact area between the tip end portion of the seed crystal and the melt; i.e., the shape of the tip end portion of the seed crystal. The melting speed can be increased with the degree of sharpness of the tip end.

As described above, the tip end portion of the seed crystal is melted to have a desired size (diameter or transverse dimension) that is sufficient to support the weight of a heavy monocrystalline ingot. Such a desired size is, for example, 8 mm or more. In the present invention, since a monocrystalline ingot can be grown continuously from the seed crystal and no slip dislocation is generated at the joint portion between the seed crystal and the grown ingot, the joint portion of the grown monocrystalline ingot can have a strength greatly larger than that of a conventionally formed neck portion having dislocation even when the joint portion has the same diameter of that of the conventional neck portion. Moreover, since the seed crystal can be grown to a desired diameter without necking operation in order to grow a silicon monocrystalline ingot. Therefore, for example, there can be saved the period of time required to perform the conventional necking operation to form a neck portion having a length of 20 cm or more.

Finally, after the tip end portion of the seed crystal is melted to have a desired size, the seed crystal is slowly pulled upwardly to form a cone portion, while the temperature, the pulling speed and the like are controlled as in the conventional CZ method. When the diameter of the crystal reaches a predetermined diameter, a straight body portion is formed. The above-described series of operations enable safe pulling of a heavy silicon monocrytalline ingot.

The diameters of silicon monocrystalline ingots recently demanded have been increased to 8 inches (200 mm) to 12 inches (300 mm) and further to 16 inches (400 mm). However, in the present invention, since necking operation is not conducted and slip dislocation is not generated, monocrystalline ingots having any diameter, length and weight can be pulled in principle without use of a crystal holding apparatus if the diameter, length and weight do not exceed the physical limit of the silicon monocrystal itself.

The present invention is not limited to the above-described embodiments. The above-described embodiments are mere examples, and those having the substantially same structure as that described in the appended claims and providing the similar action and effects are included in the scope of the present invention.

For example, the present invention can be applied not only to the ordinary CZ method but also to the MCZ method (Magnetic field applied Czochralski crystal growth method) in which a magnetic field is applied to silicon melt when a silicon monocrystal is pulled. Therefore, the term "Czochralski method" or "CZ method" encompasses not only the ordinary CZ method but also the MCZ method.

What is claimed is:

1. A method of manufacturing a silicon monocrystal using a Czochralski method in which a seed crystal is brought into contact with a silicon melt and is then slowly pulled while being rotated in order to grow a silicon monocrystalline ingot below the seed crystal, the method comprising the steps of:

provideing a seed crystal having a tip end to be brought into contact with the silicon melt, said tip end having a sharp-pointed shape or a truncation thereof;

gently bringing the tip end of the seed crystal into contact with the silicon melt and then lowering the seed crystal at a low speed in order to melt the tip end portion of the seed crystal until the size of the tip portion increases to a joint dimension; and subsequently, pulling upwardly the seed crystal slowly in order to grow a silicon monocrystalline ingot having an ingot diameter without performing necking operation.

2. A method of manufacturing a silicon monocrystal according to claim 1, wherein before the tip end of the seed crystal is gently brought into contact with the silicon melt, the seed crystal is held immediately above the silicon melt in order to increase the temperature of the seed crystal.

3. A method of manufacturing a silicon monocrystal according to claim 2, wherein the speed at which the seed crystal is lowered for melting the tip end thereof is 20 mm/min or less.

4. A method of manufacturing a silicon monocrystal according to claim 1, wherein the speed at which the seed crystal is lowered for melting the tip end thereof is 20 mm/min or less.

5. A method of manufacturing a silicon monocrystal according to claim 1, wherein said seed crystal has a conical shape or a pyramidal shape.

6. A method of manufacturing a silicon monocrystal according to claim 1, wherein before being brought into contact with the silicon melt, an initial contact area of said tip end of said seed crystal has a cross sectional area of $9\pi$ mm$^2$ or less.

7. A method of manufacturing a silicon monocrystal according to claim 1, wherein before being brought into contact with the silicon melt, an initial contact area of said tip end of said seed crystal has a cross sectional area of $2.25\pi$ mm$^2$ or less.

8. A method of manufacturing a silicon monocrystal according to claim 1, wherein before the tip end of the seed crystal is brought into contact with the silicon melt, the seed crystal is held within approximately 100 mm of the silicon melt for less than twenty minutes.

9. A method of manufacturing a silicon monocrystal according to claim 1, wherein before the tip end of the seed crystal is brought into contact with the silicon melt, the seed crystal is held within approximately 100 mm of the silicon melt for one minute or more.

10. A method of manufacturing a silicon monocrystal according to claim 1, wherein before the tip end of the seed crystal is brought into contact with the silicon melt, the seed crystal is held between 5 mm and 100 mm from the silicon melt for less than twenty minutes.

11. A method of manufacturing a silicon monocrystal according to claim 1, wherein before the tip end of the seed crystal is brought into contact with the silicon melt, the seed crystal is held between 5 mm and 100 mm of the silicon melt for one minute or more.

12. A method of manufacturing a silicon monocrystal according to claim 1, wherein before the tip end of the seed crystal is brought into contact with the silicon melt, the seed crystal is held between 5 mm and 100 mm of the silicon melt for between one minute and twenty minutes.

13. A method of manufacturing a silicon monocrystal according to claim 12, wherein the tip end is truncated.

14. A method of manufacturing a silicon monocrystal according to claim 1, wherein said tip end has a length t larger than a transverse dimension of a base of said tip end.

15. A method of manufacturing a silicon monocrystal according to claim 14, wherein the length t is between one and ten times the transverse dimension.

16. A method of manufacturing a silicon monocrystal according to claim 15, wherein the length t is between two and eight times the transverse dimension.

17. A method of manufacturing a silicon monocrystal according to claim 1, wherein said joint dimension is eight mm or more.

18. A method of manufacturing a silicon monocrystal according to claim 1, wherein a diameter of said silicon monocrystalline ingot increases continuously from the joint dimension to said ingot diameter.

* * * * *